United States Patent
Tsuruyama et al.

(10) Patent No.: US 10,775,469 B2
(45) Date of Patent: Sep. 15, 2020

(54) MAGNETIC RESONANCE IMAGING APPARATUS AND METHOD

(71) Applicant: Canon Medical Systems Corporation, Otawara-shi (JP)

(72) Inventors: Tomoya Tsuruyama, Yokohama (JP); Shuhei Nitta, Tokyo (JP); Tomoyuki Takeguchi, Kawasaki (JP)

(73) Assignee: Canon Medical Systems Corporation, Otawara-shi (JP)

( * ) Notice: Subject to any disclaimer, the term of this patent is extended or adjusted under 35 U.S.C. 154(b) by 0 days.

(21) Appl. No.: 16/386,754

(22) Filed: Apr. 17, 2019

(65) Prior Publication Data

US 2019/0324106 A1 Oct. 24, 2019

(30) Foreign Application Priority Data

Apr. 23, 2018 (JP) ................. 2018-082398

(51) Int. Cl.
*G01R 33/56* (2006.01)
*G01R 33/565* (2006.01)
*G01R 33/58* (2006.01)

(52) U.S. Cl.
CPC ..... *G01R 33/5659* (2013.01); *G01R 33/5607* (2013.01); *G01R 33/5608* (2013.01); *G01R 33/58* (2013.01)

(58) Field of Classification Search
CPC ............... G01R 33/5659; G01R 33/58; G01R 33/5608; G01R 33/5607; G01R 33/246
See application file for complete search history.

(56) References Cited

U.S. PATENT DOCUMENTS

| 4,812,753 A * | 3/1989 | Fuderer | G01R 33/341 324/307 |
| 5,600,244 A * | 2/1997 | Jensen | G01R 33/341 324/307 |
| 2007/0276220 A1* | 11/2007 | Harvey | G01R 33/546 600/410 |
| 2009/0224756 A1 | 9/2009 | Machida et al. | |
| 2016/0146908 A1* | 5/2016 | Kohler | G01R 33/246 382/131 |

(Continued)

FOREIGN PATENT DOCUMENTS

| JP | 3689509 | 8/2005 |
| JP | 2009-207756 | 9/2009 |
| JP | 4723814 | 7/2011 |

*Primary Examiner* — G. M. A Hyder
(74) *Attorney, Agent, or Firm* — Oblon, McClelland, Maier & Neustadt, L.L.P.

(57) ABSTRACT

According to one embodiment, a magnetic resonance imaging apparatus includes processing circuitry. The processing circuitry estimates transmission inhomogeneity caused in a transmit RF magnetic field from a first image based on a first signal received by a whole-body coil, and estimates reception inhomogeneity caused in a receive RF magnetic field from the first image and a second image based on a second signal received by a surface coil. The processing circuitry generates a third image, having a resolution higher than a resolution of the first image and a resolution of the second image, based on a third signal received by the surface coil. The processing circuitry corrects the third image by using the estimated transmission inhomogeneity and reception inhomogeneity.

20 Claims, 4 Drawing Sheets

(56) References Cited

U.S. PATENT DOCUMENTS

2016/0171670 A1* 6/2016 Koehler ............. G01R 33/5608
382/131
2016/0187438 A1* 6/2016 Gui ................... G01R 33/5659
324/309

\* cited by examiner

MAGNETIC RESONANCE IMAGING APPARATUS AND METHOD

CROSS-REFERENCE TO RELATED APPLICATIONS

This application is based upon and claims the benefit of priority from the prior Japanese Patent Application No. 2018-082398, filed Apr. 23, 2018, the entire contents of which are incorporated herein by reference.

FIELD Embodiments described herein relate generally to a magnetic resonance imaging apparatus and method.

BACKGROUND

A radio frequency (RF) transmit pulse which energizes signals used in a magnetic resonance imaging (MRI) apparatus produces an inhomogeneous RF magnetic field (B1) due to influences such as attenuation in a living body. Since MRI signals thereby obtained are under the influence of the inhomogeneous magnetic field B1, partial inhomogeneity in brightness, namely shading, is caused in a final version of a magnetic resonance image (MR image).

In order to correct this shading, a technique of correcting an original MR image by estimating shading in an image obtained by subjecting the original MR image to background extraction and filtering, is known.

However, with this known technique, it is difficult to extract only inhomogeneity of brightness because the MR image has a high contrast. If a lesion is included in the image, the lesion may be regarded as shading and unnecessarily corrected. Furthermore, a high resolution increases a calculation cost. In the case in which an image with varying intensity of reception signals from a coil, for example an image of lumbar vertebrae, is corrected, a part that produces a weak reception signal is excessively corrected; as a result, viewability of the corrected image is significantly degraded.

Furthermore, in the case of obtaining a plurality of images, for example a T1 weighted image and a T2 weighted image, for a single patient, the above-described technique requires a longer processing time because shading needs to be estimated in all the obtained images.

DETAILED DESCRIPTION

In general, according to one embodiment, a magnetic resonance imaging apparatus includes processing circuitry. The processing circuitry estimates transmission inhomogeneity caused in a transmit RF magnetic field from a first image based on a first reception signal received by a whole-body coil, and estimates reception inhomogeneity caused in a receive RF magnetic field from the first image and a second image based on a second reception signal received by a surface coil. The processing circuitry generates a third image, having a resolution higher than a resolution of the first image and a resolution of the second image, based on a third reception signal received by the surface coil. The processing circuitry corrects the third image by using the estimated transmission inhomogeneity and reception inhomogeneity.

Hereinafter, a magnetic resonance imaging apparatus according to the embodiments will be described with reference to the accompanying drawings. In the description below, structural elements having substantially the same functions and configurations will be denoted by the same reference symbols, and a repetitive description of such elements will be given only where necessary.

First Embodiment

Figure 1:
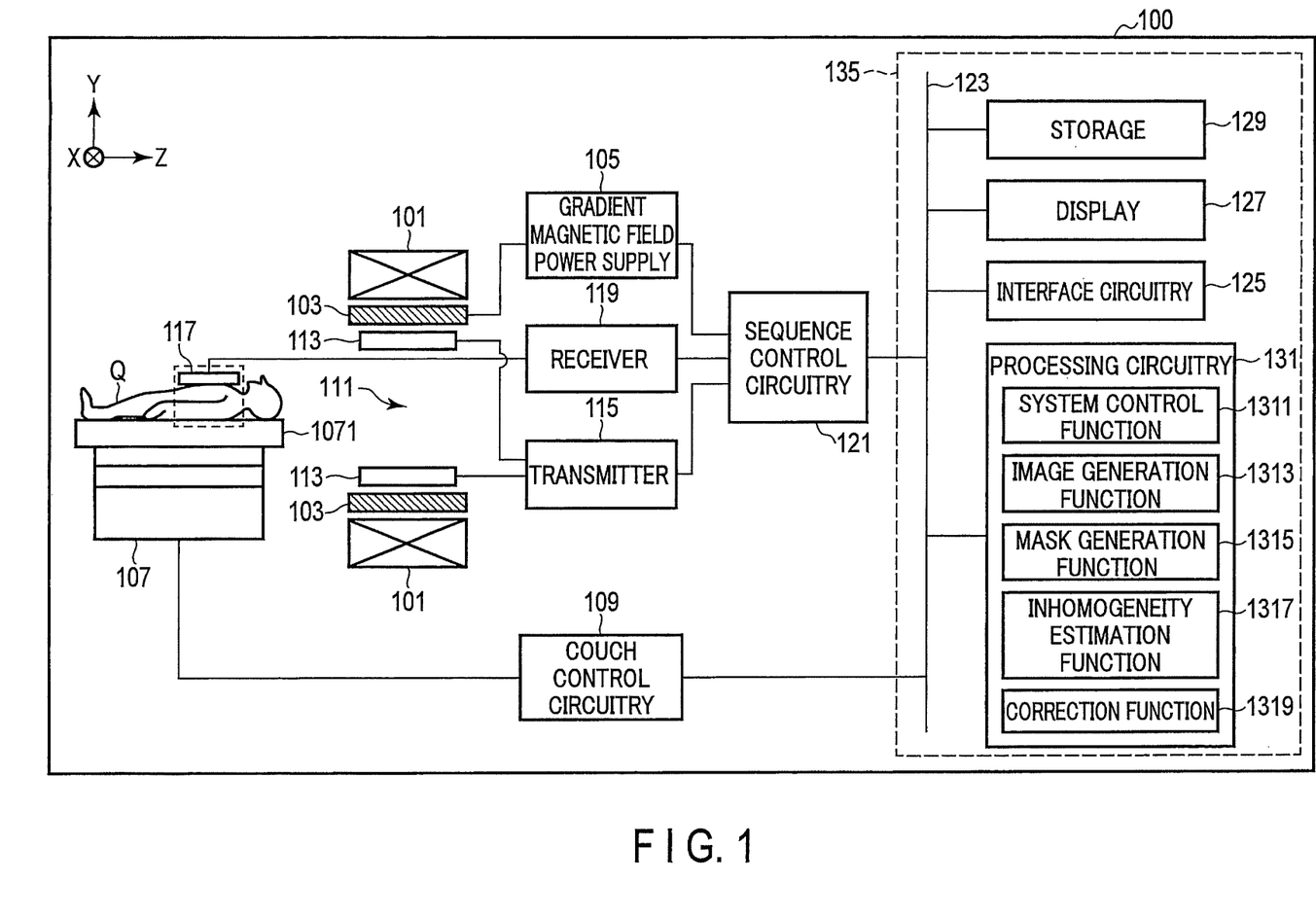
FIG. 1 is a diagram showing a configuration of a magnetic resonance imaging apparatus according to a first embodiment.

The general configuration of an MRI apparatus 100 in the present embodiment will be described with reference to FIG. 1. FIG. 1 is a diagram showing a configuration of the magnetic resonance imaging apparatus 100 in the present embodiment. As shown in FIG. 1, the MRI apparatus 100 includes a static field magnet 101, a gradient coil 103, a gradient magnetic field power supply 105, a couch 107, couch control circuitry 109, a transmitter coil 113, a transmitter 115, a receiver coil 117, a receiver 119, sequence control circuitry 121, a bus 123, an interface 125, a display 127, a storage 129, and processing circuitry 131. The MRI apparatus 100 may have a hollow, cylindrically-shaped shim coil provided between the static field magnet 101 and the gradient coil 103.

The static field magnet 101 is a magnet formed in a hollow, approximately cylindrical shape. The static field magnet 101 is not necessarily in an approximately cylindrical shape; it may be formed in an open shape. The static field magnet 101 generates a homogeneous static magnetic field in the inner space. For example, a superconducting magnet or the like is used as the static field magnet 101.

The gradient coil 103 is a hollow cylindrical coil. The gradient coil 103 is arranged inside the static field magnet 101. The gradient coil 103 is formed by a combination of three coils respectively corresponding to the X-, Y-, and Z-axes which are orthogonal to each other. The Z-axis direction is the same direction as the direction of the static magnetic field. In addition, the Y-axis direction is a vertical direction, and the X-axis direction is a direction perpendicular to each of the Z-axis and the Y-axis. The three coils of the gradient coil 103 individually receive an electric current from the gradient magnetic field power supply 105 and respectively generate gradient magnetic fields in which magnetic field intensity changes along each of the X-, Y-, and Z-axes.

The gradient magnetic fields along each of the X-, Y-, and Z-axes generated by the gradient coil 103 respectively form, for example, a gradient magnetic field for frequency encoding (readout gradient field), a gradient magnetic field for phase encoding, and a gradient magnetic field for slice selection. The gradient magnetic field for slice selection is used to determine an imaging slice. The gradient magnetic field for phase encoding is used to change the phase of an MR signal in accordance with the spatial position. The gradient magnetic field for frequency encoding is used to change the frequency of an MR signal in accordance with the spatial position.

The gradient magnetic field power supply 105 is a power supply device that supplies an electric current to the gradient coil 103 under the control of the sequence control circuitry 121.

The couch 107 is an apparatus having a couch top 1071 on which a subject P is laid. The couch 107 inserts the couch top 1071 on which the subject P is laid into the bore 111 under the control of the couch control circuitry 109. The couch 107 is installed in, for example, an examination room where the MRI apparatus 100 is installed, in such a manner that the longitudinal axis of the couch 107 is parallel to the center axis of the static field magnet 101.

The couch control circuitry 109 is circuitry that controls the couch 107, and drives the couch 107 in response to operator's instructions, via the interface 125, so as to move the couch top 1071 in the longitudinal direction and vertical direction.

The transmitter coil 113 is an RF coil provided inside the gradient coil 103. The transmitter coil 113 is supplied with the RF pulse from the transmitter 115 and generates a transmit RF wave corresponding to a radio frequency magnetic field. The transmitter coil 113 is a whole-body coil (WBC), for example. The WBC coil may be used as a transmitter/receiver coil. A cylindrical RF shield is arranged between the WBC and the gradient coil 103 to magnetically separate these coils.

The transmitter 115 supplies an RF pulse corresponding to a Larmor frequency, etc. to the transmitter coil 113 through control of the sequence control circuitry 121.

The receiver coil 117 is an RF coil provided inside the gradient coil 103. The receiver coil 117 receives MR signals that are emitted from the subject P, caused by the radio frequency magnetic field. The receiver coil 117 outputs the received MR signals to the receiver 119. The receiver coil 117 is a coil array including, for example, one or more (typically a plurality) of coil elements. The receiver coil 117 is a phased array coil (PAC), for example.

The receiver 119 generates a digital MR signal which is digitized complex data, based on the MR signal output from the receiver coil 117, under the control of the sequence control circuitry 121. Specifically, the receiver 119 performs various types of signal processing to the MR signal that is output from the receiver coil 117, and then performs analog-to-digital (A/D) conversion of data to which the variety of signal processing is performed. The receiver 119 samples the A/D-converted data. The receiver 119 thereby generates a digital MR signal (hereinafter referred to as MR data). The receiver 119 outputs the generated MR data to the sequence control circuitry 121.

The sequence control circuitry 121 controls the gradient magnetic field power supply 105, the transmitter 115, and the receiver 119 etc. in accordance with an examination protocol that is output from the processing circuitry 131, and performs imaging on the subject P. An examination protocol has a different pulse sequence in accordance with a type of examination. The examination protocol defines the magnitude of the current supplied from the gradient magnetic field power supply 105 to the gradient coil 103, timing of the supply of the current from the gradient magnetic field power supply 105 to the gradient coil 103, the magnitude of the RF pulse supplied from the transmitter 115 to the transmitter coil 113, timing of the supply of the RF pulse from the transmitter 115 to the transmitter coil 113, and timing of reception of the MR signal at the receiver coil 117, etc.

The bus 123 is a transmission path for transmitting data between the interface 125, the display 127, the storage 129, and the processing circuitry 131. The bus 123 may be connected via, for example, a network to various physiological signal-measuring devices, an external storage apparatus, and various modalities. For example, an electrocardiograph (not shown) is connected to the bus as a physiological signal measuring device.

The interface 125 has circuitry for receiving various types of instructions and information that are input from the operator. The interface 125 includes a circuit relating to, for example, a pointing device such as a mouse, or an input device such as a keyboard. The circuit included in the interface 125 is not limited to a circuit relating to a physical operational component, such as a mouse or a keyboard. For example, the interface 125 may include an electrical signal processing circuit which receives an electrical signal corresponding to an input operation from an external input device (provided separately from the present MRI apparatus 100) and outputs the received electrical signal to various circuits.

The display 127 displays, for example, various MR images generated by an image generation function, and various types of information regarding imaging and image processing, under the control of a system control function 1311 in the processing circuitry 131. The display 127 is, for example, a CRT display, a liquid crystal display, an organic EL display, an LED display, a plasma display, or any other display or a monitor known in this technical field.

The storage 129 stores, for example, MR data filled in k-space by the image generation function 1313, and image data generated by the image generation function 1313. The storage 129 stores various types of examination protocols, conditions for imaging etc., including a plurality of imaging parameters that define examination protocols. The storage 129 stores programs corresponding to various functions executed by the processing circuitry 131. The storage 129 is for example, a RAM (Random Access Memory), semiconductor memory element, such as flash memory, etc., hard disk drive, solid state drive, and optical disc, etc.

The storage 129 may also be, for example, a drive that performs reading and writing of various kinds of information on a portable storage medium, such as a CD-ROM drive, a DVD drive, or a flash memory.

The processing circuitry 131 has, as hardware resources, a processor and a memory such as a read-only memory (ROM) and a RAM (not shown), and collectively controls the present MRI apparatus 100. The processing circuitry 131 includes a system control function 1311, an image generation function 1313, a mask-generation function 1315, an inhomogeneity estimation function 1317, and a correction function 1319. Various functions performed by the system control function 1311, and the image generation function 1313, the ask-generation function 1315, the inhomogeneity estimation function 1317, and the correction function 1319 are stored in the storage 129 in the form of a program executable by a computer. The processing circuitry 131 is a processor that reads programs corresponding to the various functions from the storage 129 and executes them to realize functions corresponding to the programs. In other words, the processing circuitry 131, in a state where each of the programs is read, has a plurality of the functions etc. shown in the processing circuitry 131 of FIG. 1.

FIG. 1 illustrates that the various functions are realized by single processing circuitry 131; however, the processing circuitry 131 may include a plurality of independent processors, and the functions may be realized by each of the processors executing respective programs. In other words, each of the above-mentioned functions may be configured as a program, and executed by a single processing circuit;

alternatively, a specific function may be implemented in a dedicated independent program-execution circuit.

The term "processor" used in the above description means, for example, a CPU (central processing unit), a GPU (graphics processing unit), or circuitry such as an ASIC (application specific integrated circuit), or a programmable logic device (e.g., an SPLD (simple programmable logic device), a CPLD (complex programmable logic device), or an FPGA (field programmable gate array)).

The processor realizes various functions by reading and executing programs stored in the storage 129. The programs may be directly integrated in a circuit of the processor, instead of being stored in the storage 129. In this case, the function is realized by reading and executing the program integrated into the circuitry. Similarly, each of the couch control circuitry 109, the transmitter 115, the receiver 119, and the sequence control circuitry 121, etc. is also configured as an electronic circuit, such as the above processor.

The processing circuitry 131 controls the MRI apparatus 100 by executing the system control function 1311. Specifically, the processing circuitry 131 reads the system control program stored in the storage 129, loads it in the memory, and controls each circuitry of the present MRI apparatus 100 in accordance with the loaded system control program. For example, the processing circuitry 131 reads an examination protocol from the storage 129 by executing the system control function 1311 based on an imaging condition input by the operator via the interface 125. The processing circuitry 131 may generate the examination protocol based on the imaging condition. The processing circuitry 131 transmits the examination protocol to the sequence control circuitry 121, and controls imaging of the subject P.

The processing circuitry 131 fills MR data along a readout direction of k-space in accordance with an intensity of the readout gradient magnetic field by the image generation function 1313. The processing circuitry 131 generates an MR image by performing a Fourier transform on the MR data filled in k-space. For example, the processing circuitry 131 can generate an absolute value (magnitude) image from complex MR data. The processing circuitry 131 can also generate a phase image by using real part data and imaginary part data of the complex MR data. The processing circuitry 131 outputs an MR image, such as a magnitude image or phase image, to the display 127 and the storage 129.

Next, an example of an examination protocol performed in the present embodiment will be described with reference to the flowchart of FIG. 2.

In step S201, the processing circuitry 131, by executing the system control function 1311, obtains imaging conditions relating to a subject P (subject's ID, body part examined, etc.) from an examination order and the like.

In step S202, a positioning scan (locater scan) is performed in accordance with the imaging conditions, and a field of view (FOV) is determined to the subject P. Specifically, during the positioning scan, the subject P is laid on the couch top 1071, and a PAC is arranged on the subject P. The couch control circuitry 109 moves the couch top 1071 so that the subject P is located within an imaging space in the gantry. An FOV is then determined based on a positioning image which is obtained by the positioning scan. Since any general positioning scan can be adopted, detailed description thereof is omitted.

In step S203, a calibration scan is performed. In the calibration scan, for example, correction of a static magnetic field distribution (B0), correction of a center frequency (CF), and generation of sensitivity map indicating a spatial sensitivity map in the transmission/reception of the RF coil, are performed. As a result of the calibration scan, the processing circuitry 131 generates a calibration image by executing the image generation function 1313. The processing circuitry 131 generates a sensitivity map based on the calibration image by executing the image generation function 1313. In the calibration scan, imaging may be performed for a plurality of slices (i.e., multi-slice imaging), or for a single slice.

High resolution is not required for the calibration image, and only a resolution necessary for calibration is required. The calibration image assumed in the present embodiment has a resolution of, for example, 64 x 64 pixels.

In the present embodiment, let us suppose that two images are generated as calibration images. One is a WBC map based on a reception signal which is obtained from the MR signals received by the WBC (hereinafter, this may be referred to as a "first image"). The WBC map is generated through performing a Fourier transform on raw data obtained through the use of the WBC.

The other is a PAC map based on a reception signal which is obtained from the MR signals received by the PAC (hereinafter, this may be referred to as a "second image"). Fourier transform is performed on raw data obtained from each of the PACs, and image data corresponding to each PAC is thereby obtained. A PAC map in the present embodiment is an SOS image for which a square root of a sum of squares ("SOS") of each image data is calculated.

Herein, let us suppose that the WBC map and the PAC map have the same resolution; however, it may be the case that they have different resolutions. The WBC map and the PAC map are, for example, a proton density weighted image (PDWI).

In step S204, the processing circuitry 131 executes, for example by executing the system control function 1311, an imaging sequence of the main scan, and obtains an MR image which is used in diagnosis and targeted for correction, in accordance with the examination protocol. Since the MR image is used in diagnosis, it has a resolution higher than the resolution of the calibration image, for example 512 x 512 pixels. The MR image is, for example, a T1 weighted images, a T2 weighted image, or a fluid-attenuated inversion recovery (FLAIR) image.

In step S205, the processing circuitry 131 generates, by executing the mask-generation function 1315 and the inhomogeneity-estimation function 1317, a transmission inhomogeneity-estimation image and a reception inhomogeneity-estimation image based on the WBC map and the PAC map. The processing circuitry 131 then generates an inhomogeneity-estimation image by executing the inhomogeneity-estimation function 1317. The transmission inhomogeneity-estimation image is an image indicating transmission inhomogeneity caused in the transmit RF magnetic field. The reception inhomogeneity-estimation image is an image indicating reception inhomogeneity caused in the receive RF magnetic field.

In step S206, the processing circuitry 131 performs correction to a target image for correction by executing the correction function 1319, and thereby generates a correction image. The generated correction image is displayed on, for example, the display 127 to present the correction image to a user.

Figure 2:
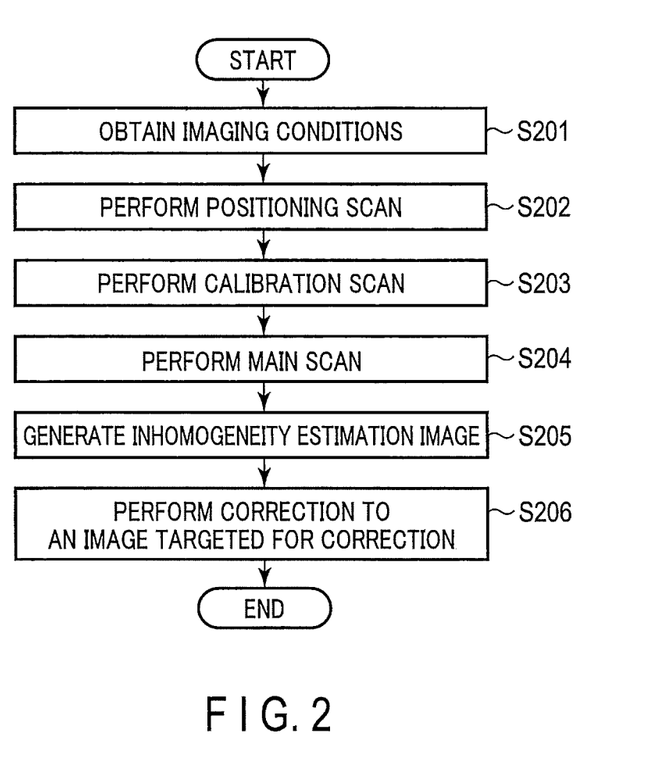
FIG. 2 is a flowchart showing an example of an examination protocol performed in the first embodiment.

The flowchart shown in FIG. 2 shows an example in which the calibration scan is performed before the main scan. The present embodiment is not limited to this example, and the calibration scan may be performed either before the positioning scan is performed in Step S202, or after the main scan in step S204. The generation of an inhomogeneity-estimation image in step S205 may be performed before or in parallel with the main scan in step S204.

Figure 3:
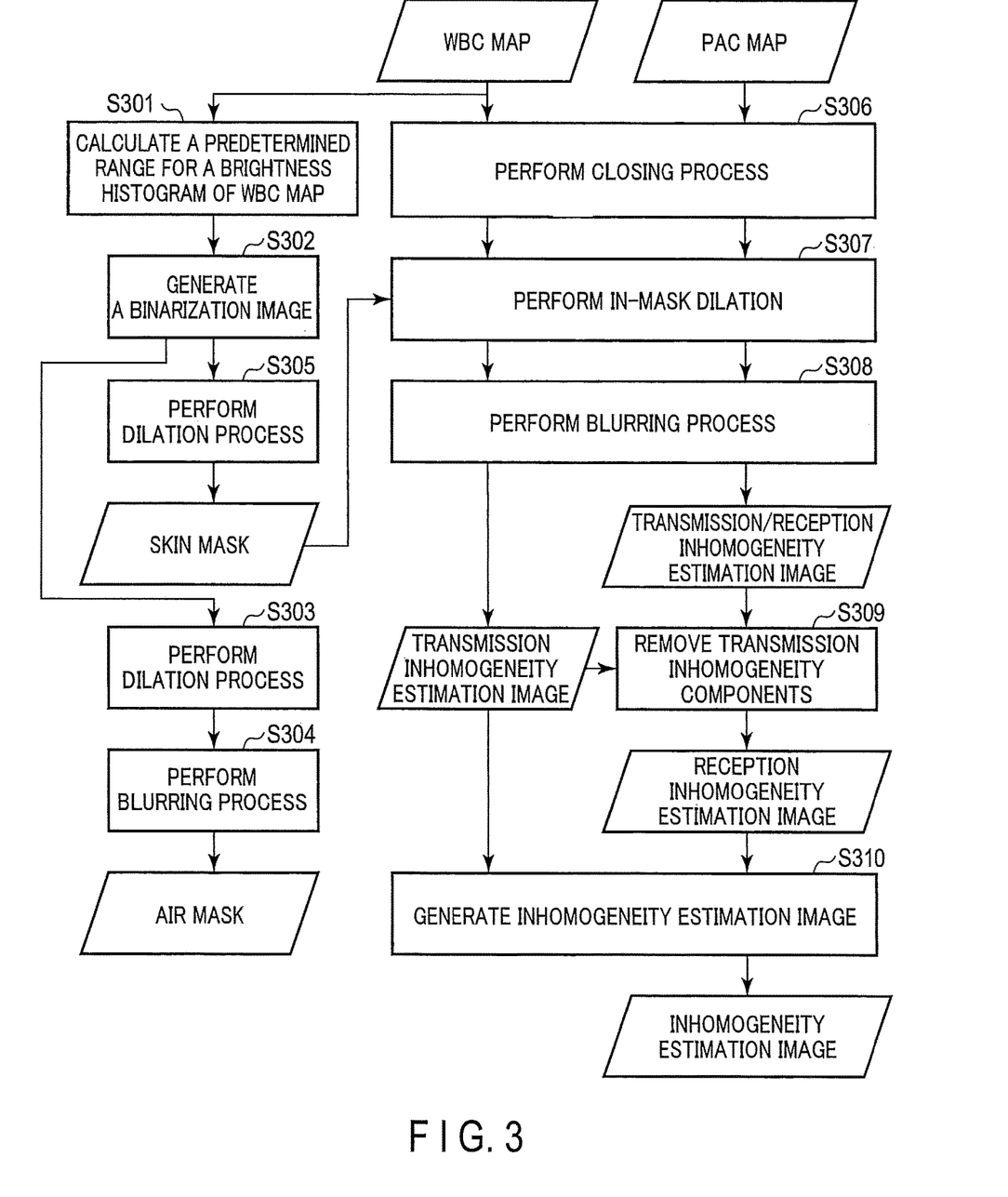
FIG. 3 is a flowchart showing an example of a mask image generation process.

Next, the inhomogeneity-estimation image generation in step S205 is described with reference to the flowchart of FIG. 3. First, the processing circuitry 131 performs a mask-generation process by executing the mask-generation function 1315.

In step S301, the processing circuitry 131 calculates, by the mask-generation function 1315, a range of brightness values based on a threshold from the distribution ratios of a brightness histogram of the WBC map. This range is used to separate a living body tissue region of the subject P from a background region (air region) in the WBC map. Specifically, a range of brightness values that make up, for example, 99% of the entire brightness histogram is calculated. The range of brightness values can either be calculated by defining brightness values smaller than a few percent of a maximum brightness value as brightness values representing the air, or from the brightness values constituting approximately 99% of accumulated probabilities.

In step S302, through the mask-generation function 1315, the processing circuitry 131 extracts, from the range of brightness values calculated in step S301, a region where the brightness values fall under the range of N percent of a maximum brightness value (N is a positive number, and herein 10) and a region where the brightness values fall short of the top N percent. The value of N in the present embodiment may be determined as appropriate in consideration of a signal-to-noise (S/N) ratio of the WBC map and an image standard deviation (SD), etc. By executing the mask-generation function 1315, the processing circuitry 131 performs binarization to assign "1" to the region where the brightness values fall within the top N percent of the maximum brightness value, and "0" to the other regions, and generates a first binarization image. The values of binarization are not limited to "1" and "0", and any two values may be adopted.

On the other hand, the processing circuitry 131 performs binarization to assign "1" to the region where the brightness values fall short of the top N percent of the maximum brightness value, and "0" to the other regions, and generates a second binarization image. The second binarization image corresponds to a boundary between the air and living tissue, in other words, a skin region of the subject P. An inverted first binarization image may be used as the second binarization image.

In step S303, by executing the mask-generation function 1315, the processing circuitry 131 performs dilation to the first binarization image. Specifically, the dilation is performed through morphology calculation in which each voxel having the pixel value "1" in the first binarization image is dilated within 1-voxel radius, for example. Since any dilation process used in general imaging processing can be adopted as the dilation process of the present embodiment, a detailed description of the dilation process is omitted.

In step S304, by executing the mask-generation function 1315, the processing circuitry 131 performs a blurring process on the second binarization image which has been dilated in step S303, and generates an air mask (which may be referred to as a "first mask image") based on the background region extracted from the WBC map. Specifically, the blurring process is a process of blurring the boundary within 1-voxel radius by the application of a smoothing filter such as a Gaussian filter. Since any blurring process used in general imaging processing can be adopted as the blurring process of the present embodiment, a detailed description of the blurring method is omitted.

In step S305, by executing the mask-generation function 1315, the processing circuitry 131 performs dilation to the second binarization image, and generates a skin mask (which may be referred to as a "second mask image") relating to the boundary between the air and the living tissue in the WBC map. Specifically, the dilation process, for example, consists of dilating each voxel in the skin region of the second binarization image within 2-voxel radius.

The mask-generation process is thus finished. The order of performing the processing in steps S303 and S304 relating to the generation of the air mask and the processing in step S305 relating to the generation of the skin mask is not predetermined, and either of the masks may be first generated. Furthermore, generation processes of the air mask and the skin mask may be performed in parallel.

Next, the processing circuitry 131 performs inhomogeneity estimation by executing the inhomogeneity-estimation function 1317.

In step S306, by executing the inhomogeneity-estimation function 1317, the processing circuitry 131 performs closing to each of the WBC map and the PAC map. Specifically, closing is performed to voxels within, for example, a 20-mm radius in each of the WBC map and the PAC map. The size of the area targeted for the closing process may be determined in accordance with a target body part of the subject P. For example, a correspondence table in which target body parts and closing sizes are associated with each other may be prepared in advance, and the processing circuitry 131 refers to the correspondence table when performing the closing so as to determine the size of the closing.

In step S307, by executing the inhomogeneity-estimation function 1317, the processing circuitry 131 performs in-mask dilation to each of the WBC map and the PAC map. Specifically, the skin mask generated in step S305 is applied (superimposed) to the WBC map to perform the dilation process to the voxels in the skin mask within 2-voxel radius. Similarly, the skin mask is applied (superimposed) to the PAC map, and the dilation within a 2-voxel radius is performed to the voxels in the skin mask. By applying the skin mask to both of the WBC map and the PAC map, a partial volume effect can be reduced in the voxels spreading across the boundary between living tissue and the background thereof (i.e., air).

In step S308, by executing the inhomogeneity-estimation function 1317, the processing circuitry 131 performs blurring on each of the WBC map and the PAC map to which the in-mask dilation process has been performed. Specifically, blurring is performed within 1-voxel radius. This WBC map-based image to which the blurring processing has been performed is called a "transmission inhomogeneity-estimation image". In the transmission inhomogeneity-estimation image, tissue contrast is suppressed and transmission inhomogeneity is reflected, through the processing from step S306 to step S308.

On the other hand, the PAC map-based image to which the blurring process has been performed is called a transmission/reception inhomogeneity-estimation image. In the transmission/reception inhomogeneity-estimation image, both of transmission inhomogeneity and reception inhomogeneity are reflected.

In step S309, by executing the inhomogeneity-estimation function 1317, the processing circuitry 131 removes the transmission inhomogeneity components from the transmission/reception inhomogeneity-estimation image, and generates a reception homogeneity-estimation image. Since the transmission/reception inhomogeneity-estimation image includes transmission homogeneity at the time of receiving signals at the PAC, the inhomogeneity components are removed by division of the PAC map-based transmission/reception inhomogeneity-estimation image by the WBC map-based transmission inhomogeneity-estimation image. As for the reception inhomogeneity-estimation image, tissue contrast is suppressed and the reception inhomogeneity is reflected, through the processing from step S306 to step S308.

The generation of the transmission inhomogeneity-estimation image based on the WBC map and the transmission/reception inhomogeneity-estimation image based on the PAC map is not limited to the above-described closing process and blurring process. In other words, any image processing can be adopted as long as tissue contrast is suppressed and sensitivity inhomogeneity is expressed in the images. For example, the transmission inhomogeneity-estimation image and the transmission/reception homogeneity-estimation image may be respectively generated by the application of one of filtering (with the use of a linear filter, a band-pass filter, or a morphology filter), fitting to a function, and neural network machine learning which is represented by a deep neural network (DNN), to the WBC map and the PAC map.

If linear processing, such as a smoothing filter, is applied when generating a reception inhomogeneity-estimation image, the PAC map may be divided by the WBC map in advance, and then the above-described processing may be performed. If non-linear processing, such as a morphology filter, is applied when generating a reception inhomogeneity-estimation image on the other hand, it should be noted that results will differ between a case where the PAC map is divided by the WBC map in advance of the image processing, and a case, as illustrated in the flowchart of FIG. 3, where a transmission/reception inhomogeneity-estimation image is divided by a transmission inhomogeneity-estimation image after the image processing.

In step S310, by executing the inhomogeneity-estimation function 1317, the processing circuitry 131 generates an inhomogeneity-estimation image as a result of estimation of overall sensitivity inhomogeneity. Specifically, suppose a transmission inhomogeneity-estimation image is TxM, and a reception inhomogeneity-estimation image is RxM, and an inhomogeneity-estimation image as a result of estimation of overall sensitivity inhomogeneity can be expressed as Expression (1) below:

$$\text{Inhomogeneity-estimation image} = TxM^\beta \times RxM \qquad (1)$$

Herein, the value of the superscript "β" may be determined as "1" so that a transmission inhomogeneity-estimation image and a reception inhomogeneity-estimation image are generated in the ratio of one to one, but may be determined as a real number determined in accordance with an imaging sequence. In other words, weight for the transmission inhomogeneity-estimation image is determined based on an imaging sequence, and the weighted transmission inhomogeneity-estimation image is multiplied with the reception inhomogeneity-estimation image, thereby obtaining an inhomogeneity-estimation image.

The value of β may be empirically determined in accordance with the imagining sequence, or may be determined with reference to a table given in accordance with a combination of imaging parameters (e.g., a flip angle). A program may learn the extent to which a transmission inhomogeneity-estimation image contributes to an imaging sequence by machine via a neural network, such as deep learning, and a result of the machine learning may be used to determine the value of β.

The inhomogeneity-estimation process is thus complete, and the generation of the inhomogeneity-estimation image shown in step S205 is thus complete.

Figure 4:
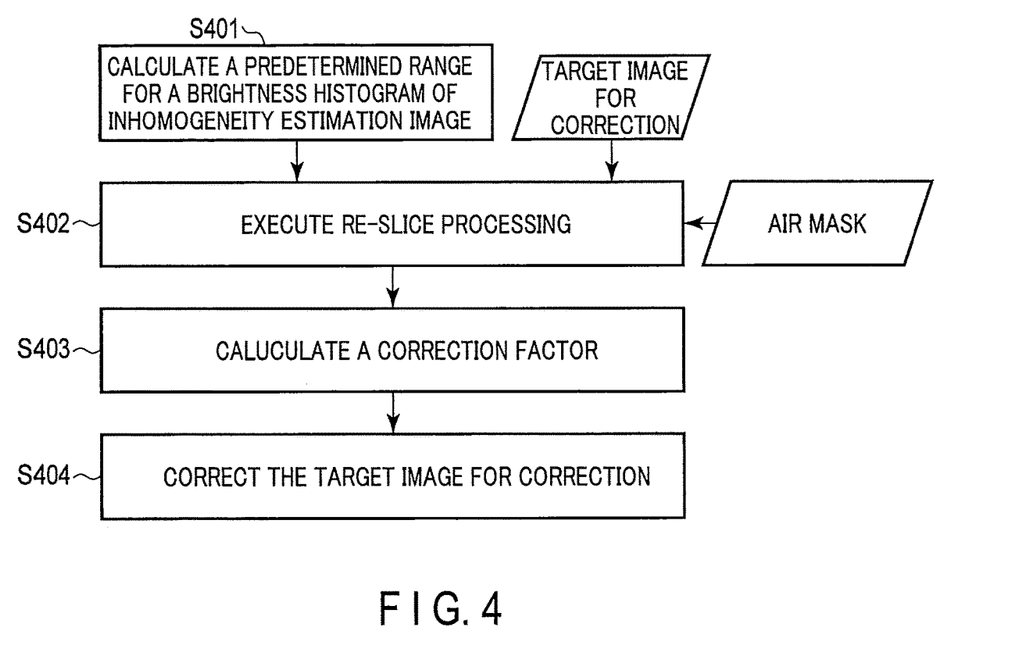
FIG. 4 is a flowchart showing an example of a correction process.

Next, the correction processing in step S206 will be described with reference to the flowchart of FIG. 4.

In step S401, by executing the correction function 1319, the processing circuitry 131 extracts a region where the brightness values fall under the N percent of the maximum brightness values in the brightness histogram of the inhomogeneity-estimation image. For example, similar to step S301, a range of brightness values that constitutes 99% of the entire brightness histogram is calculated.

In step S402, by executing the correction function 1319, the processing circuitry 131 performs re-slice processing to the inhomogeneity-estimation image and the air mask, in accordance with a coordinate and a resolution of a target image for correction.

Since the cross section in which a calibration image is obtained and the cross section in a main scan from which a target image for correction is obtained are different in most cases, a matrix (conversion matrix) for converting a coordinate system of the inhomogeneity-estimation image and the air mask into a coordinate system of the target image for correction is calculated. Through the conversion matrix, a brightness value of a pixel at a coordinate position (x',y') of the inhomogeneity-estimation image corresponding to a pixel at a coordinate position (x,y) of the target image for correction may be obtained. Since any method for calculating a conversion matrix adopted in general image processing can be adopted, detailed descriptions thereof are omitted.

Interpolation, such as linear interpolation, may be performed to increase a resolution of the inhomogeneity-estimation image and the air mask in accordance with the target image for correction. Since any interpolation method adopted in general image processing can also be adopted as the method of increasing a resolution, detailed descriptions thereof are omitted.

In step S403, by executing the correction function 1319, the processing circuitry 131 performs calculation of a correction factor. A correction factor is calculated by the following expression (2):

$$\text{Correction factor} = 1/\text{Max}(\text{pixel value of inhomogeneity-estimation image}, Y \times \gamma) \times \text{air mask} \qquad (2)$$

In other words, a restricted inverse conversion is performed on the inhomogeneity-estimation image. The expression (2) shows that the inverse of "Max(pixel value of inhomogeneity-estimation image, Y×γ)" is simply an inverse if a pixel value is equal to or greater than a threshold Y in the brightness distribution of the brightness histogram of the inhomogeneity-estimation image, and the inverse is set to take a constant value if a pixel value is smaller than the threshold Y. The value of "γ" is set to 0.2, for example; however, similar to the case of the value of "β" as described above, the value may be determined as appropriate, for example determined in accordance with a target body part or an imaging sequence, or determined with reference to a table.

Since the air mask is included as a component of the correction factor, it is possible to lower brightness in the background and to suppress background noise.

In step S404, by executing the correction function 1319, the processing circuitry 131 corrects the target image for correction. Specifically, the correction-targeted image is multiplied with the correction factor so as to generate a correction image in which inhomogeneity of sensitivity of a coil is corrected. The correction process is thus finished.

According to the foregoing present embodiment, it is possible to suppress tissue contrast and estimate each of transmission homogeneity and reception homogeneity with high accuracy through performing the above-described image-processing such as masking, closing, dilation, and blurring to the WBC map and the PAC map. The generation of an inhomogeneity-estimation image based on the separately-estimated transmission homogeneity and reception homogeneity provides higher accuracy in the estimation of inhomogeneity of a magnetic field relating to the transmission and reception of RF pulses, compared to the case where only the transmission/reception estimation image estimated based on the PAC map is used.

By multiplying a transmission inhomogeneity-estimation image by a reception inhomogeneity-estimation image, which are separately generated, with a weight suitable for an imaging sequence, it is possible to generate an inhomogeneity-estimation image in which transmission/reception inhomogeneity is estimated with high accuracy in accordance with a sequence.

Therefore, by using the inhomogeneity-estimation image, shading in an image can be corrected with high efficiency and high accuracy.

B1 shimming for controlling a transmit magnetic field may be performed based on an inhomogeneity-estimation image estimated in the present embodiment. For example, characteristics of a magnetic field distribution are known from an inhomogeneity-estimation image, and an amplitude and a phase of an RF pulse can be designed so as to make the characteristics inverted, thereby controlling the RF pulse transmission. A homogeneous B1 distribution can be thus obtained.

For example, when applying an RF pulse, a parameter of the RF pulse (position in a k-space, amplitude, and phase) can be designed with the use of a spoke technique in which a plurality of sub-pulses are applied along with a trajectory in the k-space. It is thereby possible to produce inverted characteristics of an inhomogeneous magnetic field distribution relatively easily.

The functions of the processing circuitry 131 explained in the embodiment can be executed based on a software program. The functions of the processing circuitry 131 are stored in a magnetic disc (flexible disc, hard disc, etc.), an optical disc (CD-ROM, CD-R, CD-RW, DVD-ROM, DVD±R, DVD±RW, etc.), a semiconductor memory, or a similar storage medium, as a program executable by a computer. As long as a storage medium is readable by a computer or a built-in system, any storage format can be adopted. In this case, the functions of the processing circuitry 131 can be realized by a computer reading the program from the storage medium and executing instructions written in the program on the CPU. In addition, the storage medium is not limited to a medium independent from a computer or a built-in system; a storage medium storing or temporarily storing a program downloaded through LAN (local area network) or the Internet, etc. is also adoptable. Furthermore, the functions of the processing circuitry 131 may be executed not only by means of one storage medium, but also of multiple storage media. In this case, any storage format is adaptable as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising a processing circuitry configured to:
   estimate transmission inhomogeneity caused in a transmit RF magnetic field from a first image based on a first reception signal received by a whole-body coil, and estimate reception inhomogeneity caused in a receive RF magnetic field from the first image and a second image based on a second reception signal received by a surface coil;
   generate a third image, having a resolution higher than a resolution of the first image and a resolution of the second image, based on a third reception signal received by the surface coil; and
   correct the third image by using the estimated transmission inhomogeneity and reception inhomogeneity.

2. The apparatus according to claim 1, wherein
   the first image is a sensitivity map indicating a sensitivity distribution of the whole-body coil obtained by a calibration scan, the second image is a sensitivity map indicating a sensitivity distribution of the surface coil obtained by the calibration scan, and the third image is a diagnosis image obtained by a main scan.

3. The apparatus according to claim 1, wherein
   the processing circuitry generates an inhomogeneity-estimation image by using a transmission inhomogeneity-estimation image and a reception inhomogeneity-estimation image, the transmission inhomogeneity-estimation image is generated based on the transmission inhomogeneity to which a weight is applied in accordance with an imaging sequence, and a reception inhomogeneity-estimation image is generated based on the reception inhomogeneity.

4. The apparatus according to claim 3, wherein
   the processing circuitry generates a first mask image based on a background region extracted from the first image,
   generates a correction factor for correcting the third image by using the inhomogeneity-estimation image and the first mask image.

5. The apparatus according to claim 4, wherein the processing circuitry generates a second mask image relating to a boundary between an air and living tissue by using the first image, and
   applies the second mask image to the first image and the second image.

6. The apparatus according to claim 1, wherein
   the first image and the second image have a same resolution obtained by a calibration scan.

7. The apparatus according to claim 1, wherein
   the first image and the second image are a proton-density-weighted image.

8. The apparatus according to claim 1, wherein
   the processing circuitry generates a transmission inhomogeneity-estimation image by applying, to the first image, at least one of a filtering process, a fitting process and machine learning based on neural network.

9. The apparatus according to claim 8, wherein
   the processing circuitry generates a transmission/reception inhomogeneity-estimation image by applying, to the second image, at least one of a filtering process, a fitting process, or machine learning based on neural network.

10. The apparatus according to claim 9, wherein the processing circuitry generates a reception inhomogeneity-estimation image by removing a component relating to the transmission inhomogeneity-estimation image from the transmission/reception inhomogeneity-estimation image.

11. A magnetic resonance imaging method comprising:
estimating transmission inhomogeneity caused in a transmit RF magnetic field from a first image based on a first reception signal received by a whole-body coil, and estimating reception inhomogeneity caused in a receive RF magnetic field from the first image and a second image based on a second reception signal received by a surface coil;
generating a third image, having a resolution higher than a resolution of the first image and a resolution of the second image, based on a third reception signal received by the surface coil; and
correcting the third image by using the estimated transmission inhomogeneity and reception inhomogeneity.

12. The method according to claim 11, wherein
the first image is a sensitivity map indicating a sensitivity distribution of the whole-body coil obtained by a calibration scan, the second image is a sensitivity map indicating a sensitivity distribution of the surface coil obtained by the calibration scan, and the third image is a diagnosis image obtained by a main scan.

13. The method according to claim 11, further comprising:
generating an inhomogeneity-estimation image by using a transmission inhomogeneity-estimation image and a reception inhomogeneity-estimation image, the transmission inhomogeneity-estimation image is generated based on the transmission inhomogeneity to which a weight is applied in accordance with an imaging sequence, and a reception inhomogeneity-estimation image is generated based on the reception inhomogeneity.

14. The method according to claim 13, further comprising:
generating a first mask image based on a background region extracted from the first image; and
generating a correction factor for correcting the third image by using the inhomogeneity-estimation image and the first mask image.

15. The method according to claim 14, further comprising:
generating a second mask image relating to a boundary between an air and living tissue by using the first image; and
applying the second mask image to the first image and the second image.

16. The method according to claim 11, wherein
the first image and the second image have a same resolution obtained by a calibration scan.

17. The method according to claim 11, wherein
the first image and the second image are a proton-density-weighted image.

18. The method according to claim 11, further comprising generating a transmission inhomogeneity-estimation image by applying, to the first image, at least one of a filtering process, a fitting process and machine learning based on neural network.

19. The method according to claim 18, further comprising generating a transmission/reception inhomogeneity-estimation image by applying, to the second image, at least one of a filtering process, a fitting process, or machine learning based on neural network.

20. The method according to claim 19, further comprising generating a reception inhomogeneity-estimation image by removing a component relating to the transmission inhomogeneity-estimation image from the transmission/reception inhomogeneity-estimation image.

* * * * *